US012787893B2

(12) United States Patent
An et al.

(10) Patent No.: US 12,787,893 B2
(45) Date of Patent: Nov. 3, 2026

(54) DISPLAY PANEL AND DISPLAY DEVICE

(71) Applicant: Truly (Huizhou) Smart Display Limited, Huizhou City (CN)

(72) Inventors: Beiyan An, Huizhou City (CN); Jinzhao Luo, Huizhou City (CN); Junwen Hu, Huizhou City (CN)

(73) Assignee: Truly (Huizhou) Smart Display Limited, Huizhou City (CN)

( * ) Notice: Subject to any disclaimer, the term of this patent is extended or adjusted under 35 U.S.C. 154(b) by 359 days.

(21) Appl. No.: 18/705,750

(22) PCT Filed: Nov. 23, 2021

(86) PCT No.: PCT/CN2021/132582

§ 371 (c)(1),
(2) Date: Apr. 29, 2024

(87) PCT Pub. No.: WO2023/077568

PCT Pub. Date: May 11, 2023

(65) Prior Publication Data

US 2025/0006717 A1 Jan. 2, 2025

(30) Foreign Application Priority Data

Nov. 4, 2021 (CN) ......................... 202111302017.9

(51) Int. Cl.
*H10W 90/00* (2026.01)
*H10H 29/14* (2025.01)

(52) U.S. Cl.
CPC .......... *H10W 90/00* (2026.01); *H10H 29/142* (2025.01)

(58) Field of Classification Search
CPC ....... H10H 29/142; G09F 9/302; H04N 5/225
See application file for complete search history.

(56) References Cited

U.S. PATENT DOCUMENTS 10,395,579 B2 8/2019 Tao
11,222,929 B2 1/2022 Wang et al.
(Continued)

FOREIGN PATENT DOCUMENTS

CN 106852179 A 6/2017
CN 107180851 A 9/2017
(Continued)

OTHER PUBLICATIONS

International Search Report dated Jul. 27, 2022, Application No. PCT/CN2021/132582.

*Primary Examiner* — Mohammad A Rahman
(74) *Attorney, Agent, or Firm* — The Dobrusin Law Firm, P.C.

(57) ABSTRACT

A display device, comprising: a housing, a display panel and an under-screen camera. The display panel comprises a first display area (201), a second display area (202) and a third display area (203). The second display area (202) is arranged between the first display area (201) and the third display area (203). The sub-pixel density of the first display area (201) is greater than the sub-pixel density of the second display area (202), and the sub-pixel density of the second display area (202) is greater than the sub-pixel density of the third display area (203). The pixel PPI of the first display area (201) is equal to the pixel PPI of the second display area (202), and the pixel PPI of the second display area (202) is greater than or equal to the pixel PPI of the third display area (203). The pixels in the first display area (201) are arranged in an RGB arrangement. The pixel arrangement of the second display area (202) comprises RGB arrangement and RG/BG arrangement. The pixels of the third display area (203) are arranged in an RG/BG arrangement. The under-screen camera is arranged below the third display area (203) of the display panel.

8 Claims, 1 Drawing Sheet

(56) References Cited

U.S. PATENT DOCUMENTS

| | | | |
|---|---|---|---|
| 11,335,284 | B2 | 5/2022 | Wang et al. |
| 11,832,455 | B2 | 11/2023 | Liu et al. |
| 2018/0374401 | A1 | 12/2018 | Yang et al. |
| 2020/0066809 | A1 | 2/2020 | Kunshan |
| 2021/0217372 | A1 | 7/2021 | Li et al. |
| 2021/0376011 | A1* | 12/2021 | Liu ...................... H10K 59/353 |
| 2022/0093682 | A1 | 3/2022 | Chang |

FOREIGN PATENT DOCUMENTS

| | | | |
|---|---|---|---|
| CN | 107564452 | A | 1/2018 |
| CN | 110379836 | A | 10/2019 |
| CN | 110570774 | A | 12/2019 |
| CN | 110874990 | A | 3/2020 |
| CN | 210515985 | U | 5/2020 |
| CN | 111708199 | A | 9/2020 |
| CN | 111708230 | A | 9/2020 |
| CN | 111885230 | A | 11/2020 |
| CN | 112489585 | A | 3/2021 |
| CN | 113109966 | A | 7/2021 |
| CN | 113178473 | A | 7/2021 |
| CN | 113380143 | A | 9/2021 |

* cited by examiner

DISPLAY PANEL AND DISPLAY DEVICE

FIELD OF THE INVENTION

The present disclosure relates to the field of display panels, and in particular to a display panel and a display device.

BACKGROUND OF THE INVENTION

To enhance the screen-to-body ratio of electronic devices and elevate their aesthetics, the camera under panel (CUP) emerged. Placing the camera below the screen, the existing CUP faces technical challenges: the display screen in the CUP region needs to maintain high transmittance to meet photography requirements, resulting in smaller pixels and larger pixel spacing in the CUP region compared to the normal display region, thereby lowering the resolution of the CUP. This results in a significant difference in the distribution of the boundary between the CUP region and the normal display region. This region of edge difference directly results in a distinct boundary between the CUP region and the normal display region when not capturing photos, affecting the appearance of the screen display.

SUMMARY OF THE INVENTION

An object of the present disclosure is to provide a display panel and a display device, which can significantly increase the transmittance of the CUP region and solve the problem of the noticeable difference in the distribution of the border between the CUP region and the normal display region in the existing display panel.

In a first aspect, the present disclosure provides a display panel, including a first display area, a second display area, and a third display area, the second display area being arranged between the first display area and the third display area.

In an embodiment, the second display area is annular, the first display area is arranged outside the second display area, and the third display area is arranged inside the second display area.

A sub-pixel density of the first display area is greater than a sub-pixel density of the second display area, and the sub-pixel density of the second display area is greater than a sub-pixel density of the third display area; sub-pixels in the first display area, the second display area, and the third display area form a plurality of pixel groups, sub-pixels of at least one color in each pixel group serve as setting sub-pixels, the setting sub-pixel includes a first setting sub-pixel and a second setting sub-pixel, and an area of the first setting sub-pixel is greater than an area of the second setting sub-pixel; in a pixel group in the third display area, a proportion of the first setting sub-pixel in the setting sub-pixel decreases as the pixel group moves gradually away from an adjacent boundary of the second display area and the third display area and towards a center of the third display area, and in the pixel group in the third display area, a proportion of the second setting sub-pixel in the setting sub-pixel increases as the pixel group moves gradually towards the center of the third display area.

It should be noted that since a pixel is composed of three pixels of red (R), green (G), and blue (B), the setting sub-pixel described in the present disclosure is any one of three sub-pixels of R, B, and G.

A pixel arrangement in the first display area is an RGB arrangement. A pixel arrangement of the second display area includes an RGB arrangement and an RG/BG arrangement, and the RGB arrangement is mainly concentrated at a boundary of the second display area near the first display area. A pixel arrangement of the third display area is an RG/BG arrangement.

The pixel arrangement of the RGB in the second display area is transformed into the RG/BG arrangement, the number of pixels in the second display area can be reduced by at least one-third relative to the number of pixels in the first display area, so that the light transmittance of the second display area increases, and pixels per inch (PPI) of the second display area is guaranteed to be the same as PPI of the first display area through sub-pixel rendering in the second display area, and the PPI of the second display area is greater than or equal to PPI of the third display area. Based on the second display area, the RG/BG pixel arrangement of the third display area is reduced, so that the light transmittance of the third display area is further increased compared to the light transmittance of the second display area, and the third display area serves as the CUP region.

In a second aspect, the embodiments of the present disclosure provide a display device, including:

- a housing;
- a display panel, arranged on a surface of the housing, where the display panel is the display panel according to the first aspect; and
- a CUP, arranged below a third display area of the display panel.

In the embodiments of the present disclosure, by changing the arrangement and area of the sub-pixels, the transition of the display brightness is made more uniform while ensuring the transmittance of the second display area and the third display area. At the same time, the interleaving density of the sub-pixels becomes smaller and smaller as they move away from the adjacent boundary of the first display area and the second display area and towards the center of the third display area. The transition of the two display areas, the second display area, and the third display area can be realized gradually. The PPI of the first display area is equal to the PPI of the second display area, and the PPI of the second display area is greater than or equal to the PPI of the third display area; therefore, without reducing the PPI, the light transmittance of the CUP region is improved by transforming the pixel arrangement.

BRIEF DESCRIPTION OF THE DRAWINGS

The drawings further illustrate the present disclosure, but the embodiments in the drawings do not constitute any limitation of the present disclosure.

DETAILED DESCRIPTION OF THE EMBODIMENTS

Figure 1:
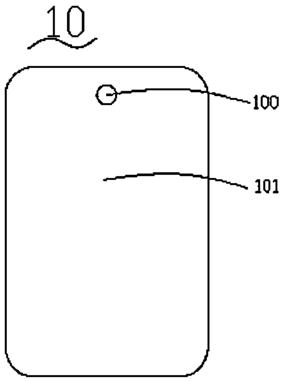
FIG. 1 is an outline structure of an existing display screen provided with a CUP.

The specific embodiments described herein are intended only to explain the present disclosure and are not intended to limit it.

In the description of the present disclosure, it is to be understood that the terms “center”, “longitudinal”, “transverse”, “length”, “width”, “thickness”, “upper”, “lower”, “front”, “back”, “left”, “right”, “vertical”, “horizontal”, “top”, “bottom”, “inner”, “outer”, “clockwise”, “counter-clockwise”, and the like indicate orientations or positional relationships based on the orientation or positional relationships shown in the drawings, merely to facilitate the description of the present disclosure and simplify the description, and do not indicate or imply that the referenced apparatuses or elements must have specific orientations and be constructed and operated in the specific orientations, and therefore should not be construed as limiting the present disclosure. Furthermore, the terms “first” and “second” are used for descriptive purposes only and are not to be construed as indicating or implying relative importance or implicitly indicating the number of technical features indicated. Thus, a feature defined as “first” or “second” may explicitly or implicitly include one or more of the features. In the description of the present disclosure, the meaning of “a plurality of” is two or more unless explicitly and specifically limited otherwise.

In the description of the present disclosure, it should be noted that, unless expressly specified or limited otherwise, the terms “mounted”, “connected with”, and “connected to” are to be interpreted broadly, e.g. it may be fixedly connected or detachably connected, or integrally connected; it may be mechanically connected, directly connected, and indirectly connected through an intermediary, and may be a communication between two elements or an interactive relationship between the two elements. The specific meaning of the above terms in the present disclosure can be understood by those skilled in the art according to specific circumstances.

In the present disclosure, unless expressly stated or limited otherwise, the first feature being on or beneath the second feature may include direct contact between the first feature and second feature or may include contact between the first feature and second feature not directly but through another feature between them. Furthermore, the first feature being “on”, “above”, and “over” the second feature may include that the first feature is directly above and diagonally above the second feature, or merely indicate that the first feature has a higher level than the second feature. The first feature being “beneath”, “below”, and “under” the second feature may include that the first feature is directly below and diagonally below the second feature, or merely indicate that the first feature has a smaller level than the second feature.

Hereinafter, the display panel and the display device provided by the embodiments of the present disclosure will be described in detail through specific embodiments and application scenarios thereof concerning the drawings.

The sub-pixels of the CUP region and the non-CUP region of the existing display panel are of the same size, but the number of pixels of the CUP region is less than that of the non-CUP region, and therefore the sub-pixel distribution of the two regions is significantly different, which results in an uneven transition of edges between the two display regions, and a significant sense of boundaries.

Referring to FIG. 1, the display region of the existing display screen provided with the CUP mainly includes CUP region 100 and non-CUP region 101. The CUP region 100 can display a picture normally by reducing the PPI of the pixels used for display in the CUP region 100 to reduce the wiring density of the backplane-driving circuit, thereby increasing the light transmittance to improve the imaging quality of the CUP. However, this method of reducing the screen PPI may impact the display effect of the image in the CUP region 100.

The main content of the present disclosure is to ensure that when the PPI of the CUP region 100 is the same as or similar to the PPI of the non-CUP region 101, the transmittance of light in the CUP region 100 is increased to achieve a high-quality image display effect of the CUP.

Figure 2:
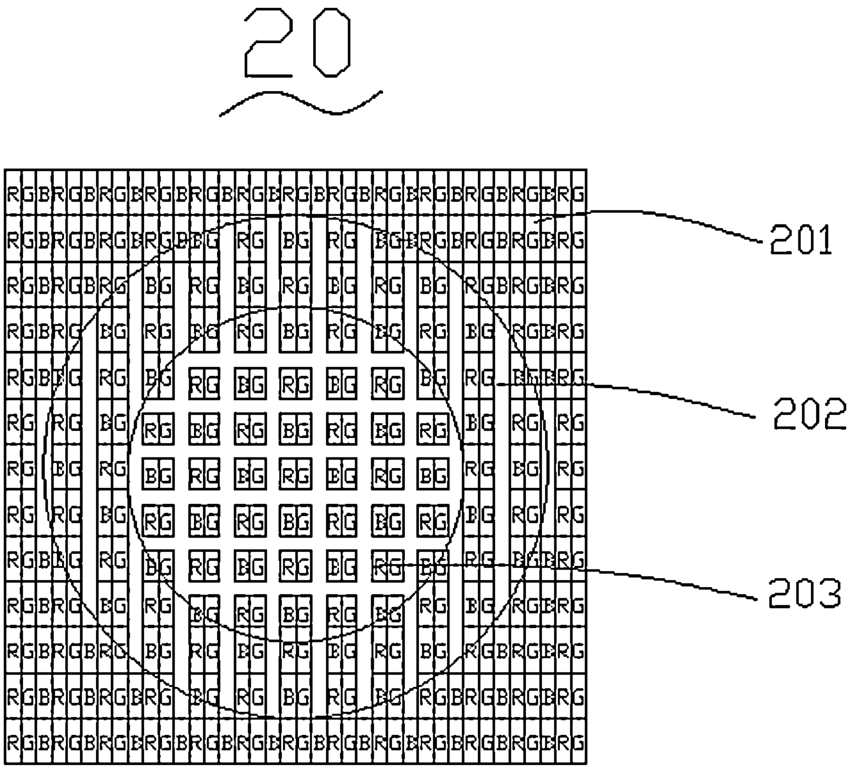
FIG. 2 is an arrangement diagram of pixel groups according to an embodiment of the present disclosure.

Referring to FIG. 2, the embodiment provides a display panel, including a first display area 201, a second display area 202, and a third display area 203; the first display area 201 can be a main display area, such as a display screen of an electronic device, and the third display area 203 can be a CUP display area for arranging a photosensitive device, such as a camera, below the third display area. The second display area 202 is arranged between the first display area 201 and the third display area 203 for transitioning the display area. It should be noted that since the position of the camera may be any position on the edge of the screen of the electronic device, a plurality of adjacent boundaries of the second display area 202 and the first display area 201 may be provided. Since the CUP region requires a certain transparency for satisfying the photographing performance, the sub-pixel density of the first display area 201 is greater than the sub-pixel density of the third display area 203, so that the third display area 203 can achieve the purpose of both transparency and display functions. To make the transition more uniform, the second display area 202 is arranged between the first display area 201 and the third display area 203, the sub-pixel density of the second display area 202 being greater than the sub-pixel density of the third display area 203 and at the same time smaller than the sub-pixel density of the first display area 201.

The pixel arrangement of the first display area 201 is RGB; the pixel arrangement at the boundary of the second display area 202 near the first display area 201 is RGB, and the pixel arrangement at the boundary of the second display area 202 near the third display area 203 is RG/BG; the pixel arrangement of the third display area 203 is RG/BG. By transforming from the RGB pixel arrangement to the RG/BG pixel arrangement, it is achieved that:

1. To maintain the same PPI of the third display area 203 as that of the first display area 201, namely, achieving the same display effect as that of the RGB arrangement, a display effect is achieved through sub-pixel rendering (reducing the number of sub-pixels by sharing sub-pixels between adjacent pixels to achieve the effect of simulating a high resolution with a low resolution) in the second display area.
2. When the RGB pixel arrangement in the second display area 202 is transformed into the RG/BG pixel arrangement, a spare region will be added to increase the light transmittance, and therefore the light transmittance of the second display area 202 is at least 30% higher than that of the first display area 201.
3. The RG/BG pixel arrangement of the third display area 203 is also applicable to the sub-pixel rendering mode, and therefore the pixel circuit size can be reduced, the wiring density can be further reduced, and the light transmittance of the third display area 203 is at least 30% higher than that of the second display area 202.
4. The pixel design of the CUP region not only satisfies the same PPI as that of the first display area 201 but also greatly improves the light transmittance to satisfy the display effect of high-quality pictures.

The sub-pixels of at least one color in each pixel group in the display area serve as setting sub-pixels, the setting sub-pixel includes a first setting sub-pixel and a second setting sub-pixel, and an area of the first setting sub-pixel is greater than an area of the second setting sub-pixel; the uniform transition is achieved by varying the size or number of setting sub-pixels. Referring to FIG. 2, the first setting sub-pixels are arranged in the first display area 201, and the second setting sub-pixels are interspersed in the third display area 203. It should be noted that since pixels are composed of three pixels of R, G, and B, the setting sub-pixel described in the embodiment is any one of three sub-pixels of R, B, and G. The larger the area of the same sub-pixel, the greater its brightness; the brightness relationship of sub-pixels of different colors in the same area from greatest to least is: G, R, B.

In the pixel group of the third display area 203, since a CUP is provided below the third display area 203, a certain light transmittance needs to be ensured. Therefore, a certain number of the first setting sub-pixels need to be arranged in the third display area 203, and the light transmittance needs to be satisfied on the premise of having a display effect, enabling a smooth transition between the first display area 201 and the third display area 203. Therefore, in the pixel group of the display area, the proportion of the second setting sub-pixel in the setting sub-pixel gradually increases as the pixel group moves gradually towards the center of the third display area 203, which also makes the pattern displayed on the display area more uniform.

Referring to FIG. 2, in the embodiment, in the case where the first display area 201 adopts the RGB arrangement, the pixel group includes three columns of sub-pixels and the color of the sub-pixels in each column is one of R, G, and B, for example, the sub-pixels in each column from left to right in each pixel group in the first display area 201 in FIG. 2 are R, G, and B, respectively; the arrangement order of the colors can be changed according to the requirements of different display panels.

In addition, the sub-pixels in the embodiment are rectangular; in one possible embodiment, the shape of the sub-pixels may also be circular, rhombic, or other shapes that meet the display requirements.

The embodiment further provides a display device, including a housing, a display panel, and a CUP; and the housing can be a shell of an electronic device, such as a mobile phone shell. The display panel is arranged on the surface of the housing, and the display panel is the display panel in the above embodiment. The CUP is arranged below the third display area of the display panel, and the CUP is configured to acquire external image data.

Each technical feature of the above-mentioned embodiments can be combined in any combination, and to make the description concise, not all the possible combinations of each technical feature in the above-mentioned embodiments are described; however, as long as there is no contradiction between the combinations of these technical features, they should be considered as the scope of the specification.

The embodiments described above represent only a few embodiments of the present disclosure and are described in more detail and are not to be construed as limiting the scope of the present disclosure. It should be noted that several variations and modifications can be made by the skilled in the art without departing from the concept of the present disclosure, which is within the scope of protection of the present disclosure. Therefore, the scope of protection of the patent for the present disclosure shall be subject to the attached claims.

The invention claimed is:

1. A display panel, comprising:
- a first display area, a second display area, and a third display area, the second display area being arranged between the first display area and the third display area, wherein
- a sub-pixel density of the first display area is greater than a sub-pixel density of the second display area, and the sub-pixel density of the second display area is greater than a sub-pixel density of the third display area;
- pixels per inch (PPI) of the first display area is equal to PPI of the second display area, and the PPI of the second display area is greater than or equal to PPI of the third display area;
- a pixel arrangement in the first display area is an RGB arrangement;
- a pixel arrangement of the second display area comprises an RGB arrangement and an RG/BG arrangement; and
- a pixel arrangement of the third display area is an RG/BG arrangement.

2. The display panel according to claim 1, wherein the second display area is annular, the first display area is arranged outside the second display area, and the third display area is arranged inside the second display area.

3. The display panel according to claim 1, wherein
- sub-pixels in the first display area, the second display area, and the third display area form a plurality of pixel groups, sub-pixels of at least one color in each pixel group serve as setting sub-pixels, the setting sub-pixel comprises a first setting sub-pixel and a second setting sub-pixel, and an area of the first setting sub-pixel is greater than an area of the second setting sub-pixel; and
- in a pixel group in the third display area, a proportion of the first setting sub-pixel in the setting sub-pixel decreases as the pixel group moves gradually away from an adjacent boundary of the second display area and the third display area and towards a center of the third display area, and a proportion of the second setting sub-pixel in the setting sub-pixel increases as the pixel group moves gradually towards the center of the third display area.

4. The display panel according to claim 1, wherein a pixel arrangement at a boundary of the second display area near the first display area is RGB, and a pixel arrangement at a boundary of the second display area near the third display area is RG/BG.

5. A display device, comprising:
- a housing;
- a display panel, arranged on a surface of the housing, wherein the display panel is the display panel according to claim 1; and
- a camera under panel (CUP), arranged below a third display area of the display panel.

6. A display device, comprising:
- a housing;
- a display panel, arranged on a surface of the housing, wherein the display panel is the display panel according to claim 2; and
- a camera under panel (CUP), arranged below a third display area of the display panel.

7. A display device, comprising:
- a housing;
- a display panel, arranged on a surface of the housing, wherein the display panel is the display panel according to claim 3; and
- a camera under panel (CUP), arranged below a third display area of the display panel.

8. A display device, comprising:
- a housing;
- a display panel, arranged on a surface of the housing, wherein the display panel is the display panel according to claim 4; and a camera under panel (CUP), arranged below a third display area of the display panel.

* * * * *